(12) United States Patent  
Casey

(10) Patent No.: US 8,979,622 B2
(45) Date of Patent: Mar. 17, 2015

(54) LOUVER SYSTEM

(76) Inventor: Daniel P. Casey, Seattle, WA (US)

( * ) Notice: Subject to any disclaimer, the term of this patent is extended or adjusted under 35 U.S.C. 154(b) by 537 days.

(21) Appl. No.: 13/424,045

(22) Filed: Mar. 19, 2012

(65) Prior Publication Data

US 2013/0165037 A1 Jun. 27, 2013

Related U.S. Application Data

(63) Continuation-in-part of application No. 12/551,214, filed on Aug. 31, 2009, now abandoned.

(51) Int. Cl.
*F24F 13/15* (2006.01)

(52) U.S. Cl.
USPC ............ 454/319; 454/314; 454/318; 454/325

(58) Field of Classification Search
CPC .................. F24F 2011/0075; F24F 13/082
USPC ......... 454/258, 265, 268, 270, 273, 278, 284, 454/288, 290, 297, 309, 313, 314, 318, 319, 454/325, 327, 329, 330, 332
See application file for complete search history.

(56) References Cited

U.S. PATENT DOCUMENTS

| | | | |
|---|---|---|---|
| 4,181,253 A | | 1/1980 | Barlow |
| 5,348,078 A | * | 9/1994 | Dushane et al. ............... 165/209 |
| 5,364,304 A | | 11/1994 | Hampton |
| 5,443,420 A | * | 8/1995 | Kim et al. ...................... 454/256 |
| 6,053,809 A | | 4/2000 | Arceneaux |
| 6,072,397 A | | 6/2000 | Ostrowski |
| 6,537,146 B1 | * | 3/2003 | Haynes ......................... 454/290 |
| 7,522,063 B2 | | 4/2009 | Ehlers |
| 2004/0159713 A1 | | 8/2004 | Schmidt et al. |
| 2006/0286918 A1 | | 12/2006 | Vargas |
| 2007/0202794 A1 | | 8/2007 | Antill |
| 2009/0149123 A1 | * | 6/2009 | Blagg ............................ 454/258 |

* cited by examiner

*Primary Examiner* — Kang Hu
*Assistant Examiner* — Dana Tighe

(57) ABSTRACT

A louver system for controlling airflow in a duct from a forced air heating, ventilation, and air conditioning (HVAC) system with a housing and a louver located on a mounting fascia. The system having a longitudinal slat located in the perimeter wall that is movable between the fully open position and the fully closed position via a slat positioning assembly. The slat positioning assembly is powered by a mainspring assembly. A winding assembly is operatively coupled to the mainspring assembly which is wound by a motor or a hand crank. A local control system having a microprocessor, a transmitter, and a receiver sends a positioning signal to the slat positioning assembly that rotates the slat to a specified position via power from the mainspring assembly.

23 Claims, 7 Drawing Sheets

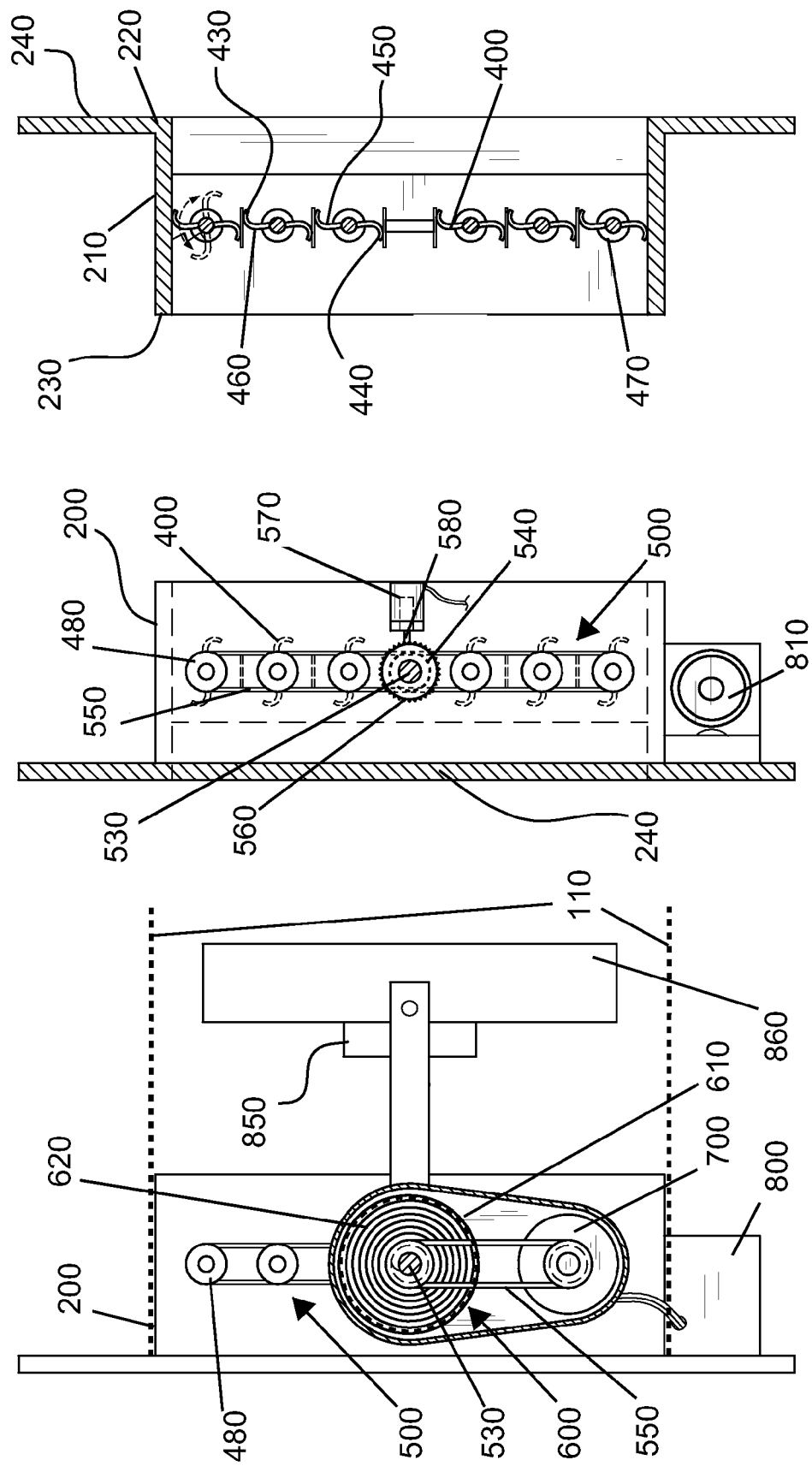

LOUVER SYSTEM

CROSS REFERENCE

This application claims priority to U.S. non-provisional application Ser. No. 12/551,214 filed Aug. 31, 2009 as a continuation-in-part, the specification of which is incorporated herein by reference in its entirety.

BACKGROUND OF THE INVENTION

Energy in various forms has been used to bring safety and comfort to the homes of people for generations. Even though there are numerous benefits associated with energy and its use, the associated costs can become quite significant. Fossil fuels are a frequently used, yet limited resource that must be managed wisely to preserve its availability for future generations. Conservation of energy not only helps today's user with their personal expenses, but it also helps society as a whole. The present invention teaches a system to control airflow from a duct from a forced air heating ventilation and air conditioning system to conserve energy.

SUMMARY

The present invention features a louver system for controlling airflow in a duct from a forced air heating, ventilation, and air conditioning (HVAC) system. In some embodiments, the system comprises a housing and a movable louver located on a mounting fascia.

In some embodiments, the system comprises a longitudinal slat located in the perimeter wall. In some embodiments, the system comprises a slat positioning assembly operatively coupled to the slat. In some embodiments, the system comprises a mainspring assembly operatively coupled to the slat positioning assembly. In some embodiments, the system comprises a winding assembly operatively coupled to the mainspring assembly. In some embodiments, the system comprises a motor and a hand crank operatively coupled to the winding assembly.

In some embodiments, the system comprises a local control system having a microprocessor, a transmitter, and a receiver that is operatively connected to the slat positioning assembly. In some embodiments, the local control system receives an activation signal then sends a positioning signal to the slat positioning assembly. In some embodiments, the slat positioning assembly rotates the slat to a specified position via power from the mainspring assembly.

In some embodiments, in the first position, the slat allows airflow. In some embodiments, in the second position, the slat inhibits airflow. In some embodiments, in a position between the first position and the second position, the slat allows a reduced airflow. In some embodiments, the mainspring assembly is wound via the winding assembly. In some embodiments, the winding assembly is actuated via the hand crank or the motor.

In some embodiments, the local control system is operatively connected to the motor. In some embodiments, the system comprises a power supply operatively connected to the motor and the local control system. In some embodiments, the system comprises an electricity generator comprising a turbine operatively connected to the power supply.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE DRAWINGS

FIG. 4 is a side view of the present invention.
FIG. 5 is a cross-sectional view in a sagittal plane of the present invention.
FIG. 6 is a cross-sectional view in a sagittal plane of the present invention.

DESCRIPTION OF PREFERRED EMBODIMENTS

Figure 1:
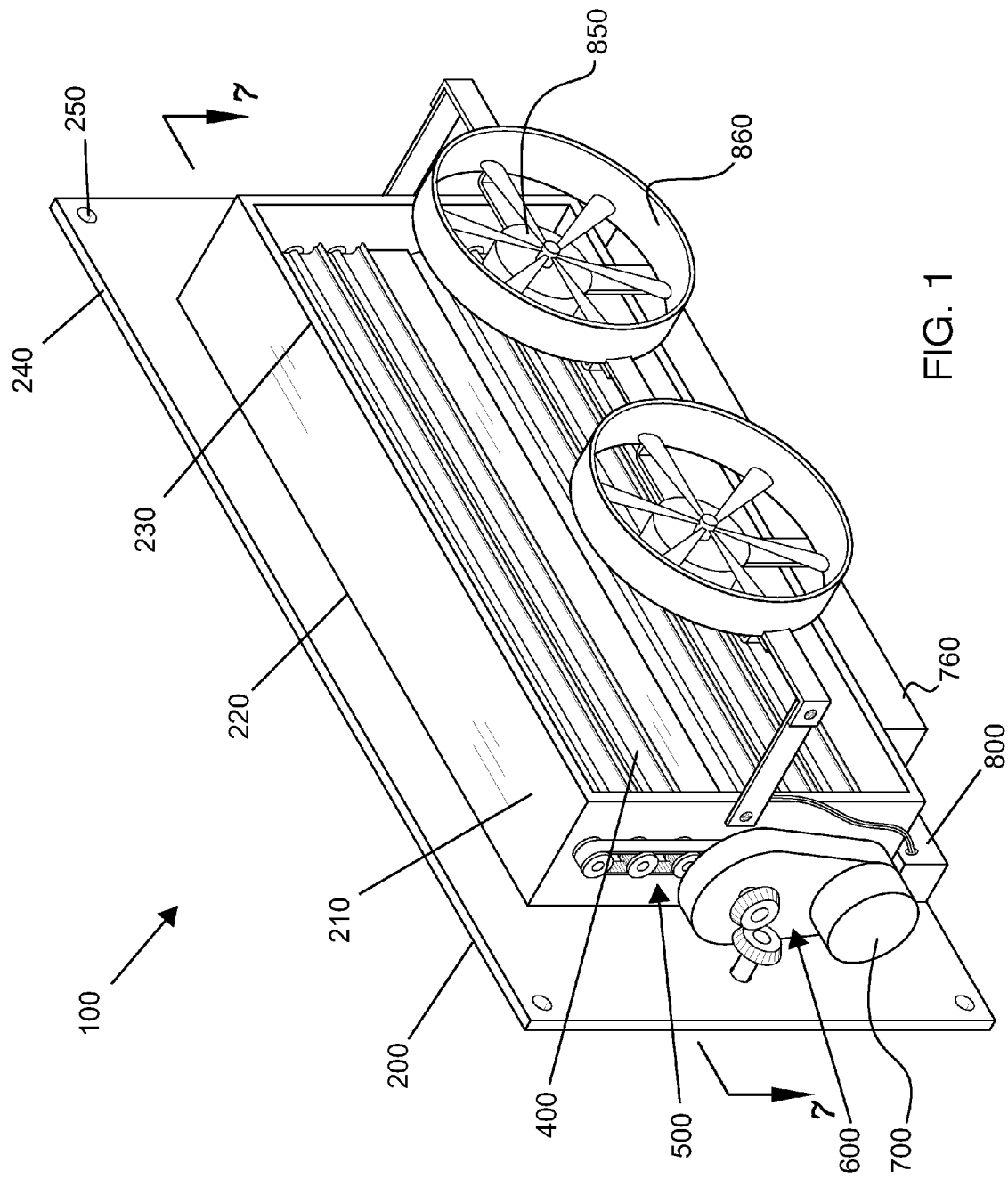
FIG. 1 is a perspective view of the present invention.
Figure 2:
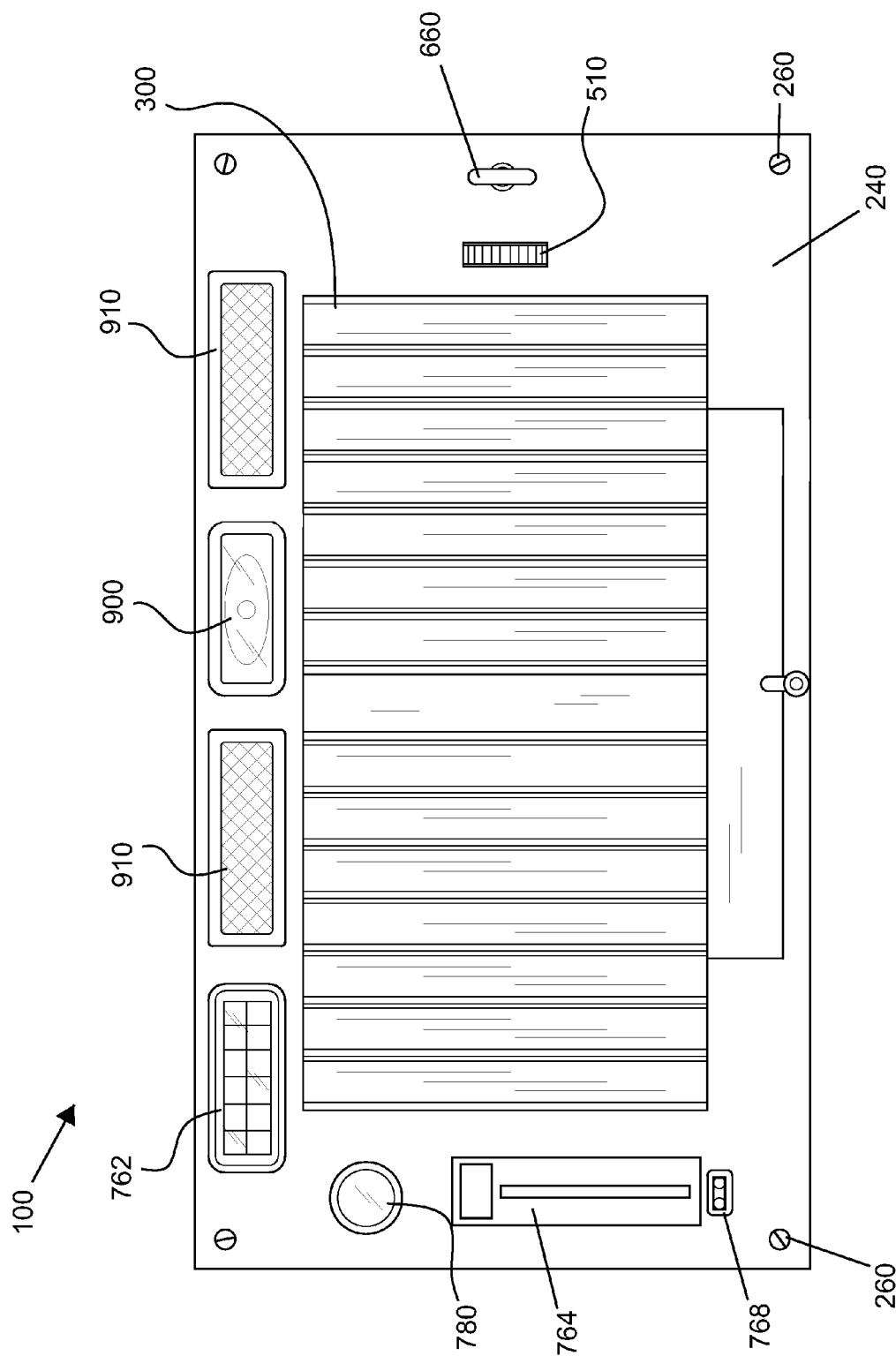
FIG. 2 is a front view of the present invention.
Figure 3:
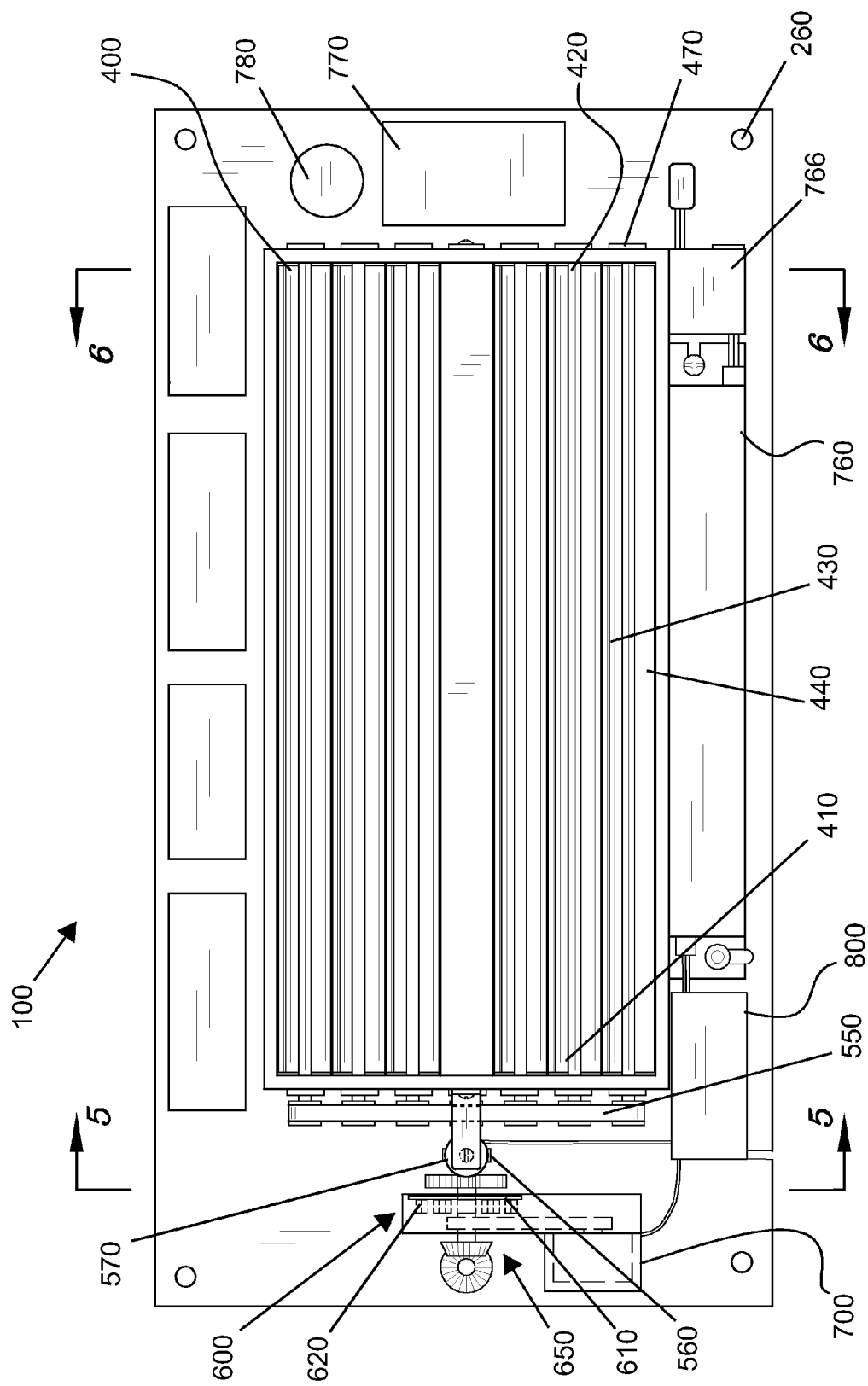
FIG. 3 is a rear view of the present invention.
Figure 7:
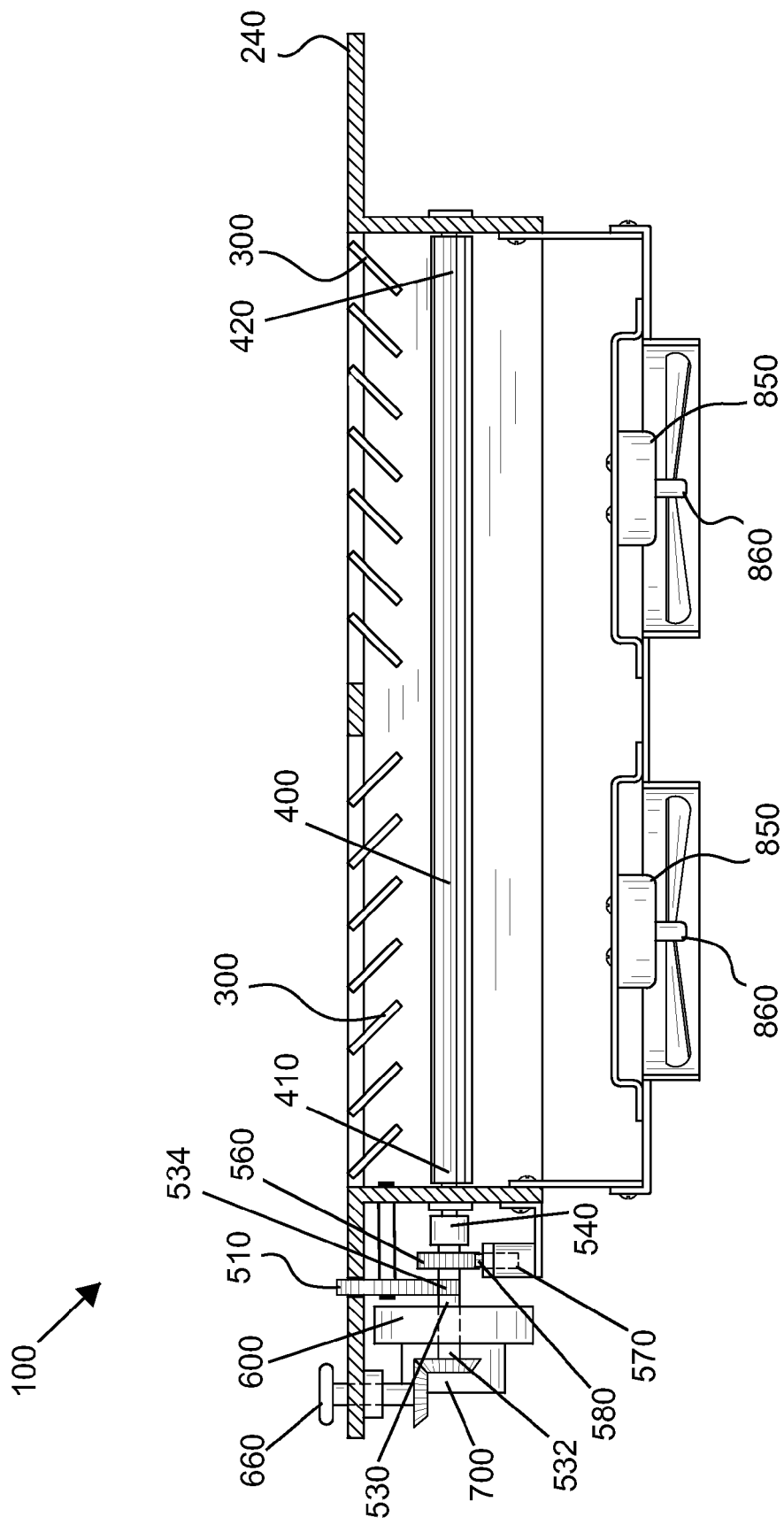
FIG. 7 is a cross-sectional view in a transverse plane of the present invention.
Figure 8:
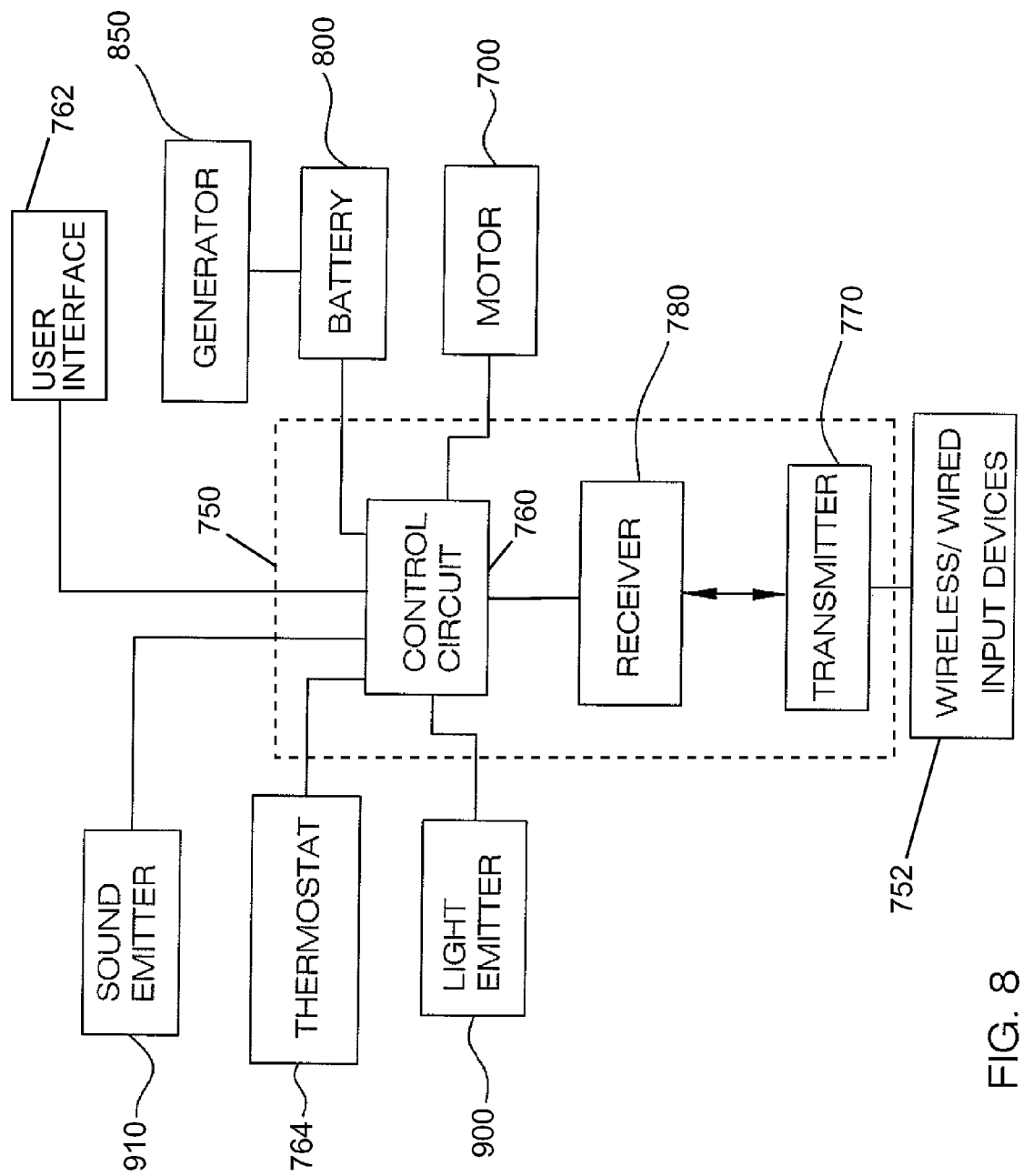
FIG. 8 is a schematic view of the present invention.
Figure 9:
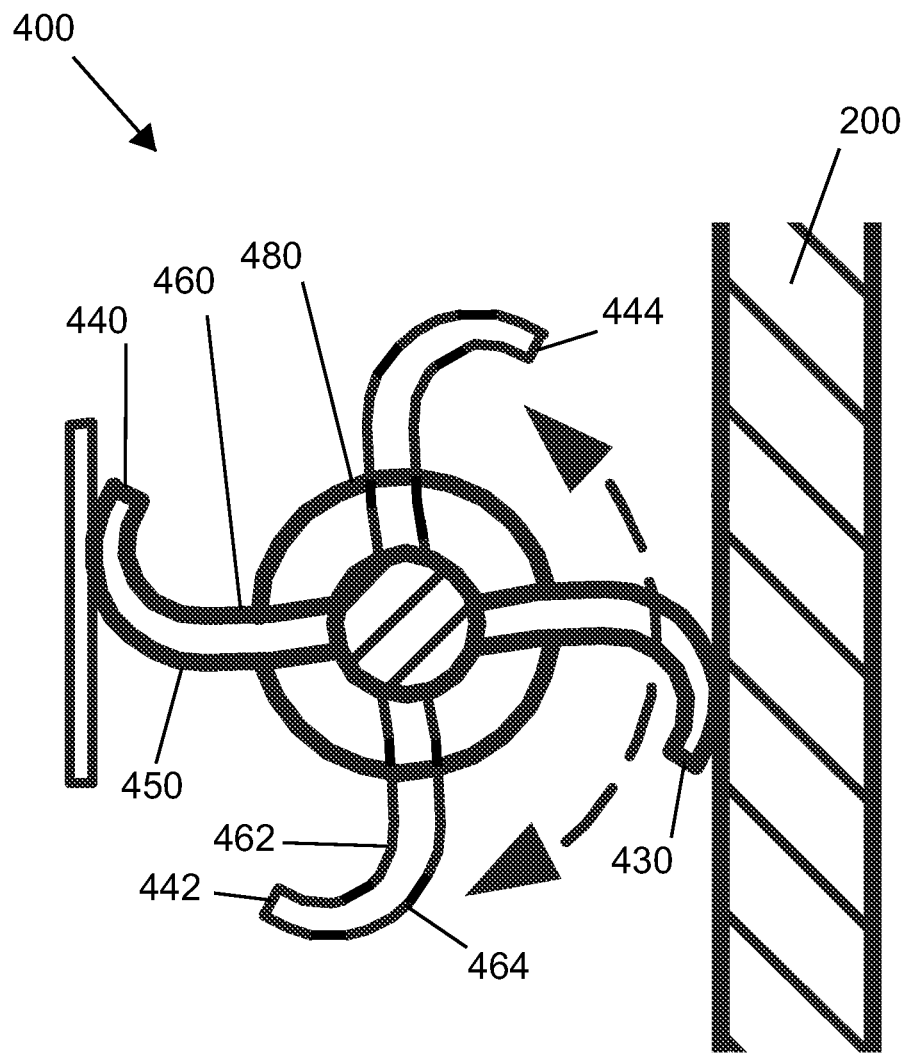
FIG. 9 is a cross-sectional view in a sagittal plane of an alternate embodiment of the slat of the present invention.

Following is a list of elements corresponding to a particular element referred to herein:
  100 Louver system
  110 Duct
  200 Housing
  210 Housing perimeter wall
  220 Housing front edge
  230 Housing rear edge
  240 Mounting fascia
  250 Mounting aperture
  260 Fastener
  300 Louver
  400 Slat
  410 Slat first end
  420 Slat second end
  430 Slat first side edge
  440 Slat second side edge
  442 Slat third side edge
  444 Slat fourth side edge
  450 Slat first surface
  460 Slat second surface
  462 Slat third surface
  464 Slat fourth surface
  470 Bearing
  480 Slat positioning wheel
  500 Slat positioning assembly
  510 Manual slat positioner
  530 Main shaft
  532 Main shaft first end
  534 Slat positioner gear
  540 Main shaft positioning wheel
  550 Drive belt
  560 Positioning gear
  570 Solenoid actuator
  580 Engagement tip
  600 Mainspring assembly
  610 Ratcheting mechanism
  620 Spring coil
  650 Winding assembly
  660 Hand crank
  700 Motor
  750 Local control system
  752 Remote system
  760 Microprocessor 762 User interface
764 Thermostat
766 Wireless network communication card
768 Communication port
770 Transmitter
780 Receiver
800 Power supply
810 Rechargeable battery
850 Electricity generator
860 Turbine
900 Light emitter
910 Sound emitter Referring now to FIG. 1-9, the present invention features a louver system (100) for controlling airflow in a duct (110) from a forced air heating, ventilation, and air conditioning (HVAC) system.

In some embodiments, the system (100) comprises a housing (200) having a housing perimeter wall (210), a housing front edge (220), a housing rear edge (230), and a mounting fascia (240) located on the housing front edge (220). In some embodiments, the mounting fascia is able to be mounted (abutted) against an outside surface of a wall. In some embodiments, the housing perimeter wall (210) connects with a duct (110) in a wall. In some embodiments, the housing perimeter wall (210) connects with a duct (110) not located in a wall.

In some embodiments, the system (100) comprises an adjustable louver that can be rotated (300) located on the mounting fascia (240). In some embodiments, the positional louver (300) is manually positioned.

In some embodiments, the system (100) comprises a longitudinal slat (400). In some embodiments, the slat (400) comprises a slat first end (410), a slat second end (420), a slat first side edge (430), a second side edge (440), a slat first surface (450), and a slat second surface (460). In some embodiments, the slat first end (410) is located in the housing perimeter wall (210) where it can rotate. In some embodiments, the slat second end (420) is located in the housing perimeter wall (210) where it can rotate. In some embodiments, a slat positioning wheel (480) is located on the slat first end (410). In some embodiments, a slat positioning wheel (480) is located on the slat second end (420).

In some embodiments, the longitudinal slat (400) comprises a slat third surface (462) and a slat fourth surface (464). In some embodiments, the longitudinal slat (400) comprises a slat third side edge (442), and a slat fourth side edge (444). In some embodiments, the longitudinal slat (400) comprises slat surfaces that are evenly spaced with respect to the angular position relative to one another when viewed from a sagittal plane.

In some embodiments, in a fully open position, the slat first side edge (430) is positioned toward the housing front edge (220) and the slat second side edge (440) is positioned toward the housing rear edge (230). In some embodiments, in a fully open position, the slat second side edge (440) is positioned toward the housing front edge (220) and the slat first side edge (430) is positioned toward the housing rear edge (230).

In some embodiments, the slat (400) is positioned fully in-line with a direction of airflow from a duct (110). In some embodiments, in the fully open position the slat (400) does not impede the airflow in the duct.

In some embodiments, in a fully closed position, the slat first side edge (430) is located toward the housing perimeter wall (210) and the slat second side edge (440) is located toward the housing perimeter wall (210). In some embodiments, the slat (400) is positioned fully perpendicular to the direction of airflow from the duct (110). In some embodiments, the slat first surface (450) or the slat second surface (460) faces the direction of airflow from the duct (110). In some embodiments, in the fully closed position the slat (400) impedes the airflow in the duct.

In some embodiments, the slat (400) is able to be rotated in a single continuous direction. In some embodiments, the slat (400) is able to be rotated in any direction. In some embodiments, the slat (400) is infinitely adjustable between the fully open position and the fully closed position.

In some embodiments, the system (100) comprises a slat positioning assembly (500) located in the housing (200). In some embodiments, the slat positioning assembly (500) comprises a centrally located main shaft (530). In some embodiments, the main shaft (530) has a main shaft positioning wheel (540) located on the main shaft (530) close to a main shaft first end (532). In some embodiments, the main shaft (530) is located parallel to the slat (400). In some embodiments, a drive belt (550) is located on and engages the main shaft positioning wheel (540) and the slat positioning wheel (480).

In some embodiments, a positioning gear (560) is located on the main shaft (530) close to the main shaft first end (532). In some embodiments, a solenoid actuator (570) is located in the housing (200). In some embodiments, the solenoid actuator (570) comprises an engagement tip (580) for engaging the positioning gear (560). In some embodiments, the solenoid actuator (570) comprises an engagement wheel for engaging the positioning gear (560). In some embodiments, the solenoid actuator (570) comprises an engagement gear for engaging the positioning gear (560).

In some embodiments, the system (100) comprises a mainspring assembly (600) located in the housing (200). In some embodiments, the mainspring assembly (600) comprises a ratcheting mechanism (610) operatively coupled to the main shaft (530). In some embodiments a spring coil (620) is operatively coupled to the ratcheting mechanism (610). In some embodiments, the ratcheting mechanism (610) holds the spring coil (620) in a static position of potential energy. In some embodiments, the ratcheting mechanism (610) allows the spring coil (620) to be wound into a position of potential energy.

In some embodiments, the system (100) comprises a winding assembly (650) located in the housing (200) operatively coupled to the mainspring assembly (600). In some embodiments, the winding assembly (650) comprising a hand crank (660). In some embodiments, the hand crank (660) projects through an aperture disposed on the mounting fascia (240). In some embodiments, upon actuation of the hand crank, the mainspring assembly is rewound. In some embodiments, the hand crank (660) is a knob. In some embodiments, the hand crank (660) is a crank.

In some embodiments, the system (100) comprises a motor (700) located in the housing (200) operatively coupled to the winding assembly (650). In some embodiments, the winding assembly (650) comprises a safety mechanism connected to the spring coil (620) to avoid over winding, for example, a ratcheting mechanism or a clutch mechanism.

In some embodiments, the system (100) comprises a local control system (750) located in the housing (200) having a microprocessor (760), a transmitter (770), and a receiver (780). In some embodiments, the local control system (750) is operatively connected to the slat positioning assembly (500). In some embodiments, the local control system (750) is operatively connected to the motor (700). In some embodiments, the local control system (750) is operatively connected to the solenoid actuator (570).

In some embodiments, the local control system (750) comprises a position sensor disposed on the main shaft (530). In some embodiments, the position sensor is disposed on the slat positioning assembly (500). In some embodiments, the position sensor is operatively connected to the microprocessor (760). In some embodiments, the position sensor sends a signal to the microprocessor (760) corresponding to the position of the slat (400).

In some embodiments, the system (100) comprises a power supply (800) located in the housing (200) operatively connected to the motor (700) and the local control system (750). In some embodiments, the power supply (800) is alternating current electricity. In some embodiments, the power supply (800) is direct current electricity.

In some embodiments, the system (100) comprises an electricity generator (850) located in the housing (200) comprising a turbine (860). In some embodiments, the electricity generator (850) and the turbine (860) can rotate. In some embodiments, the electricity generator (850) is operatively connected to the power supply (800). In some embodiments, when airflow is present, the turbine (860) rotates the electricity generator (850) thereby producing a current. In some embodiments, the current charges the power supply (800).

In some embodiments, the system (100) comprises a plurality of electricity generators (850) comprising turbines (860) located in the housing (200). In some embodiments, the electricity generators (850) and turbines (860) can rotate.

In some embodiments, upon receiving an activation signal, the local control system (750) sends a positioning signal via the microprocessor (760) to the solenoid actuator (570). In some embodiments, the solenoid actuator (570) releases the stored energy from the mainspring assembly (600) via the disengagement of the engagement tip (580) from the positioning gear (560) to actuate the slot positioning assembly (500). In some embodiments, the slat positioning assembly (500) rotates the slat (400) to a specified position. In some embodiments, the specified position is determined by the position sensor.

In some embodiments, in the fully open position, the slat (400) allows airflow. In some embodiments, in the fully closed position, the slat (400) inhibits airflow. In some embodiments, in a position between the fully open position and the fully closed position (partially open), the slat (400) allows an inhibited rate of airflow.

In some embodiments, the mainspring assembly (600) is wound via the winding assembly (650). In some embodiments, the winding assembly (650) is actuated via the hand crank (660) or the motor (700). In some embodiments, the mainspring assembly (600) provides potential energy to rotate the slat positioning assembly (500). In some embodiments, the ratcheting mechanism (610) allows for winding the spring coil (620) in a manner to avoid overwinding.

In some embodiments, a sound emitter (910) located in the housing (200) is operatively connected to the microprocessor (760). In some embodiments, upon receiving a signal from the microprocessor (760), the sound emitter (910) emits a sound. In some embodiments, operating power is supplied to the sound emitter (910) via the power supply (800), via the microprocessor (760). In some embodiments, the sound from the sound emitter (910) is an alarm sound. In some embodiments, the sound from the sound emitter (910) is music, for example background music. In some embodiments, the sound from the sound emitter (910) is a voice, for example from an intercom system.

In some embodiments, a light emitter (900) located in the housing (200) is operatively connected to the microprocessor (760). In some embodiments, upon receiving a signal from the microprocessor (760), the light emitter (900) emits light. In some embodiments, operating power is supplied to the light emitter (900) via the power supply (800), via the microprocessor (760). In some embodiments, the light from the light emitter (900) is an emergency light. In some embodiments, the light from the light emitter (900) is a night light. In some embodiments, the light from the light emitter (900) is a standard light for room illumination. In some embodiments, the light from the light emitter (900) flashes.

In some embodiments, the light emitter (900) comprises a light emitting diode. In some embodiments, the light emitter (900) comprises a fluorescent light unit. In some embodiments, the light emitter (900) comprises an incandescent light bulb. In some embodiments, the light emitter (900) comprises a xenon light unit. In some embodiments, the light emitter (900) comprises a halogen light unit.

In some embodiments, a manual slat positioner (510) is located on the housing (200). In some embodiments, the manual slat positioner (510) is operatively connected to the slat positioning assembly (500) via the slat positioner gear (534). In some embodiments, the slat positioner gear (534) is disposed on the main shaft (530) proximal to the main shaft first end (532). In some embodiments, the manual slat positioner (510) is operatively connected to the main shaft (530) via the slat positioner gear (534). In some embodiments, the manual slat positioner (510) engages a ratcheting mechanism operatively coupled to the main shaft (530). In some embodiments, the ratcheting mechanism is operatively coupled to the slat positioner gear (534). In some embodiments, the ratcheting mechanism allows the main shaft (530) to rotate independent of the manual slat positioner (510) using standard will know practices.

In some embodiments, the system (100) comprises a plurality of slats (400) that can be rotated, located in the housing perimeter wall (210). In some embodiments, in the fully closed position, a first slat first side edge (430) closely approaches a second slat second side edge (440) without interfacing. In some embodiments, a divider is positioned between the first slat first side edge (430) and the second slat second side edge (440). In some embodiments, in the fully closed position, a first slat first side edge (430) closely approaches the divider without interfacing. In some embodiments, in the fully closed position, a second slat second side edge (440) closely approaches the divider without interfacing.

In some embodiments, the system (100) comprises four slats (400). In some embodiments, the system (100) comprises three slats (400). In some embodiments, the system (100) comprises two slats (400). In some embodiments, the system comprises more than four slats (400).

In some embodiments, the slats (400) traverse the housing perimeter wall (210) in a series. In some embodiments, the slats (400) are operatively coupled together via a slat positioning wheel (480), a drive belt (550), and a main shaft positioning wheel (540). In some embodiments, in the fully open position, the slats (400) allow airflow. In some embodiments, in the fully closed position, the slats (400) inhibit airflow. In some embodiments, in a position between the fully open position and the fully closed position (partially open), the slats (400) allow an inhibited rate of airflow.

In some embodiments, the power supply (800) is a rechargeable battery (810).

In some embodiments, the system (100) comprises a user interface (762) located in the housing (200). In some embodiments, the user interface (762) is operatively connected to the microprocessor (760). In some embodiments, the user interface (762) comprises a keypad. In some embodiments, the user interface (762) comprises an infrared sensor. In some embodiments, the user interface (762) comprises an alphanumeric display. In some embodiments, the user interface (762) is a liquid crystal display. In some embodiments, the user interface (762) comprises light emitting diodes.

In some embodiments, the system (100) comprises a thermostat (764) located in the housing (200). In some embodiments, the thermostat (764) is operatively connected to the microprocessor (760). In some embodiments, the thermostat controls the louver system (100) on which it is located. In some embodiments, the user interface (762) comprises a thermostat (764). In some embodiments, the local control system (750) comprises a thermostat (764).

In some embodiments, the slat positioning assembly (500) is coupled to the winding assembly (650). In some embodiments, upon receiving an activation signal via the microprocessor (760), solenoid actuator (570) and engagement tip (580) can disengage from the slat positioning gear (560) to allow the slat (400) to spin freely via the airflow that passes through the housing (200). In some embodiments, upon spinning freely, the slat (400) activates the winding assembly (650) to wind the mainspring assembly (600). In some embodiments, the slat (400) rotates in a direction opposite to the specific rotational direction of operation for slat (400) positioning in order to wind the mainspring assembly (600).

In some embodiments, a plurality of adjustable louvers (300) are located on the mounting fascia (240) and are able to be rotated. In some embodiments, the louvers (300) are coupled together and operate as a single unit.

In some embodiments, the housing (200) is generally rectangular. In some embodiments, the housing perimeter wall (210) is generally rectangular. In some embodiments, the housing (200) is generally circular or elliptical. In some embodiments, the housing perimeter wall (210) is generally circular or elliptical.

In some embodiments, the housing (200) comprises a power supply status indicator located thereon.

In some embodiments, the slat (400) comprises a curved shaped slat first surface (450) or slat second surface (460). In some embodiments, the slat (400) comprises a curved shaped slat third surface (462) or slat fourth surface (464). In some embodiments, a cross-section of the slat (400) in a sagittal plane is "S" shaped. In some embodiments, a cross-section of the slat (400) in a sagittal plane is "C" shaped. In some embodiments, a cross-section of the slat (400) in a sagittal plane is "O" shaped. In some embodiments, a cross-section of the slat (400) in a sagittal plane is "I" shaped. In some embodiments, a cross-section of the slat (400) in a sagittal plane is "X" shaped.

In some embodiments, the slat first end (410) comprises a bearing (470). In some embodiments, the slat second end (420) comprises a bearing (470). In some embodiments, the slat first end (410) is located in the housing perimeter wall (210) via the bearing (470) and able to be rotated. In some embodiments, the slat second end (420) is located in the housing perimeter wall (210) via the bearing (470) and able to be rotated.

In some embodiments, the local control system (750) is operatively connected to a remote system (752). In some embodiments, the receiver (780) of the local control system (750) receives a signal from the remote system (752). In some embodiments, the transmitter (770) of the local control system (750) sends a signal to the remote system (752). In some embodiments, the signal is sent via radio spectrum. In some embodiments, the remote system (752) is a central heat and air conditioning (HVAC) system for a building.

In some embodiments, the local control system (750) is operatively connected to a remote system (752). In some embodiments, the receiver (780) of the local control system (750) receives a signal from the remote system (752). In some embodiments, the transmitter (770) of the local control system (750) sends a signal to the remote system (752). In some embodiments, the signal is sent via infrared spectrum. In some embodiments, the remote system (752) is a central heat and air conditioning (HVAC) system for a building.

In some embodiments, the local control system (750) is operatively connected to a remote system (752). In some embodiments, the receiver (780) of the local control system (750) receives a signal from the remote system (752). In some embodiments, the transmitter (770) of the local control system (750) sends a signal to the remote system (752). In some embodiments, the signal is sent via analog signals or digital signals through the metal duct work. In some embodiments, the signal is send via digital signals riding on analog waves through the metal duct work. In some embodiments, the remote system (752) is a central heat and air conditioning (HVAC) system for a building.

In some embodiments, the local control system (750) comprises a wireless network communication card (766) operatively connected thereto. In some embodiments, the local control system (750) can be operated via a computer, or a mobile phone. In some embodiments, the local control system (750) is connected via wires, for example, an Ethernet (network) cable. In some embodiments, the local control system (750) comprises a communications port (768) operatively connected thereto.

In some embodiments, a plurality of louver systems (100) is used. In some embodiments, the plurality of louver systems (100) is operated by the remote system (752). In some embodiments, the plurality of louver systems (100) is operated by the local control system (750) of a master louver system (100).

In some embodiments, the housing (200) comprises a plurality of mounting apertures (250). In some embodiments, the housing (200) mounts to and interfaces with a duct (110) via fasteners (260) located through the mounting apertures (250).

As used herein, the term "about" refers to plus or minus 10% of the referenced number. For example, an embodiment wherein the device is about 10 inches in length includes a device that is between 9 and 11 inches in length.

The disclosures of the following U.S. Patents are incorporated in their entirety by reference herein: U.S. Pat. Pub. 2004/0159713, U.S. Pat. Pub. 2006/0286918, U.S. Pat. Pub. 2007/0202794, U.S. Pat. Nos. 6,053,809, 7,522,063.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims.

The reference numbers recited in the below claims are solely for ease of examination of this patent application, and are exemplary, and are not intended in any way to limit the scope of the claims to the particular features having the corresponding reference numbers in the drawings.

What is claimed is:

1. A louver system (100) for controlling airflow in a duct (110) from a forced air heating, ventilation, and air conditioning (HVAC) system comprising:
   (a) a housing (200) having a housing perimeter wall (210), a housing front edge (220), a housing rear edge (230), and a mounting fascia (240) disposed on the housing front edge (220);
   (b) a positionable louver (300) rotatably disposed on the mounting fascia (240);
   (c) a longitudinal slat (400), wherein the slat (400) comprises a slat first end (410), a slat second end (420), a slat first side edge (430), a second side edge, a slat first surface (450), a slat second surface (460), and a slat positioning wheel (480) disposed on the slat first end (410), wherein the slat first end (410) is rotatably disposed in the housing perimeter wall (210), wherein the slat second end (420) is rotatably disposed in the housing perimeter wall (210), wherein, in a fully open position, the slat first side edge (430) is disposed toward the housing front edge (220) and the slat second side edge (440) is disposed toward the housing rear edge (230) or the slat second side edge (440) is disposed toward the housing front edge (220) and the slat first side edge (430) is disposed toward the housing rear edge (230), wherein the slat (400) is positioned fully in-line with a direction of airflow from a duct (110), whereby in the fully open position the slat (400) does not impede the airflow in the duct, wherein, in a fully closed position, the slat first side edge (430) is disposed toward the housing perimeter wall (210) and the slat second side edge (440) is disposed toward the housing perimeter wall (210), wherein the slat (400) is positioned fully perpendicular to the direction of airflow from the duct (110), wherein the slat first surface (450) or the slat second surface (460) faces the direction of airflow from the duct (110), whereby in the fully closed position the slat (400) impedes the airflow in the duct, wherein, the slat (400) is rotatable in a single continuous direction, wherein the slat (400) is infinitely positionable between the fully open position and the fully closed position;
   (d) a slat positioning assembly (500) disposed in the housing (200) comprising a centrally located main shaft (530) having a main shaft positioning wheel (540) disposed on the main shaft (530) proximal to a main shaft first end (532), wherein the main shaft (530) is disposed parallel to the slat (400), wherein a drive belt (550) is disposed on and engages the main shaft positioning wheel (540) and the slat positioning wheel (480), wherein a positioning gear (560) is disposed on the main shaft (530) proximal to the main shaft first end (532), wherein a solenoid actuator (570) is disposed in the housing (200), wherein the solenoid actuator (570) comprises an engagement tip (580) for engaging the positioning gear (560);
   (e) a mainspring assembly (600) disposed in the housing (200), wherein the mainspring assembly (600) comprises a ratcheting mechanism (610) operatively coupled to the main shaft (530), wherein a spring coil (620) is operatively coupled to the ratcheting mechanism (610);
   (f) a winding assembly (650) disposed in the housing (200) operatively coupled to the mainspring assembly (600) comprising a hand crank (660), wherein the hand crank (660) projects through an aperture disposed on the mounting fascia (240), wherein upon actuation of the hand crank, the mainspring assembly is rewound;
   (g) a motor (700) disposed in the housing (200) operatively coupled to the winding assembly (650), wherein upon actuation of the motor, the mainspring assembly is rewound;
   (h) a local control system (750) disposed in the housing (200) having a microprocessor (760), a transmitter (770), and a receiver (780), wherein the local control system (750) is operatively connected to the slat positioning assembly (500), wherein the local control system (750) is operatively connected to the motor (700), wherein the local control system (750) is operatively connected to the solenoid actuator (570);
   (i) a power supply (800) disposed in the housing (200) operatively connected to the motor (700) and the local control system (750); and
   (j) an electricity generator (850) rotatably disposed in the housing (200) comprising a turbine (860), wherein the electricity generator (850) is operatively connected to the power supply (800), wherein when airflow is present, the turbine (860) rotates the electricity generator (850) thereby producing a current, wherein the current charges the power supply (800);
   wherein upon receiving an activation signal, the local control system (750) sends a positioning signal via the microprocessor (760) to the solenoid actuator (570), wherein the solenoid actuator (570) releases the stored energy from the mainspring assembly (600) to actuate the slot positioning assembly (500) via the positioning gear (560) and the engagement tip (580), wherein the slat positioning assembly (500) rotates the slat (400) to a specified position, wherein in the fully open position, the slat (400) allows airflow, wherein the fully closed position, the slat (400) inhibits airflow, wherein in a position between the fully open position and the fully closed position (partially open), the slat (400) allows an inhibited rate of airflow, wherein the mainspring assembly (600) is wound via the winding assembly (650), wherein the winding assembly (650) is actuated via the hand crank (660) or the motor (700).

2. The system (100) of claim 1, wherein a sound emitter (910) disposed in the housing (200) is operatively connected to the microprocessor (760), wherein upon receiving a signal from the microprocessor (760), the sound emitter (910) emits a sound, wherein operating power is supplied to the sound emitter (910) via the power supply (800), via the microprocessor (760).

3. The system (100) of claim 1, wherein a light emitter (900) disposed in the housing (200) is operatively connected to the microprocessor (760), wherein upon receiving a signal from the microprocessor (760), the light emitter (900) emits light, wherein operating power is supplied to the light emitter (900) via the power supply (800), via the microprocessor (760).

4. The system (100) of claim 1, wherein a manual slat positioner (510) is disposed on the main shaft (530), wherein the manual slat positioner (510) is operatively connected to the slat positioning assembly (500), via a slat positioner gear (534).

5. The system (100) of claim 1, wherein the system (100) comprises a plurality of slats (400) rotatably disposed in the housing perimeter wall (210), wherein in the fully closed position, a first slat first side edge (430) closely approaches a second slat second side edge (440) without interfacing, wherein the slats (400) traverse the housing perimeter wall (210) in a series, wherein the slats (400) are operatively coupled together, wherein in the fully open position, the slats (400) allow airflow, wherein the fully closed position, the slats (400) inhibit airflow, wherein in a position between the fully open position and the fully closed position (partially open), the slats (400) allow an inhibited rate of airflow.

6. The system (100) of claim 1, wherein the power supply (800) is a rechargeable battery (810).

7. The system (100) of claim 1 wherein the system (100) comprises a user interface (762) disposed in the housing (200), wherein the user interface (762) is operatively connected to the microprocessor (760).

8. The system (100) of claim 1, wherein the system (100) comprises a thermostat (764) disposed in the housing (200), wherein the thermostat (764) is operatively connected to the microprocessor (760).

9. The system (100) of claim 1, wherein the slat positioning assembly (500) is coupled to the winding assembly (650), wherein upon receiving an activation signal via the microprocessor (760), the slat (400) can spin freely via the airflow that passes through the housing (200), wherein upon spinning freely, the slat (400) activates the winding assembly (650) to wind the mainspring assembly (600).

10. The system (100) of claim 1, wherein a plurality of positionable louvers (300) are rotatably disposed on the mounting fascia (240).

11. The system (100) of claim 1, wherein the housing (200) is generally rectangular, wherein the housing perimeter wall (210) is generally rectangular.

12. The system (100) of claim 1, wherein the housing (200) is generally circular or elliptical, wherein the housing perimeter wall (210) is generally circular or elliptical.

13. The system (100) of claim 1, wherein the housing (200) comprises a power supply status indicator disposed thereon.

14. The system (100) of claim 1, wherein the system (100) comprises a plurality of electricity generators (850) comprising turbines (860) rotatably disposed in the housing (200).

15. The system (100) of claim 1, wherein the slat first surface (450) or slat second surface (460) comprises a curved surface.

16. The system (100) of claim 1, wherein the slat first end (410) comprises a bearing (470), wherein the slat second end (420) comprises a bearing (470), wherein the slat first end (410) is rotatably disposed in the housing perimeter wall (210) via the bearing (470), wherein the slat second end (420) is rotatably disposed in the housing perimeter wall (210) via the bearing (470).

17. The system (100) of claim 1, wherein the local control system (750) is operatively connected to a remote system (752), wherein the receiver (780) of the local control system (750) receives a signal from the remote system (752), wherein the transmitter (770) of the local control system (750) sends a signal to the remote system (752), wherein the signal is sent via radio spectrum.

18. The system (100) of claim 1, wherein the local control system (750) is operatively connected to a remote system (752), wherein the receiver (780) of the local control system (750) receives a signal from the remote system (752), wherein the transmitter (770) of the local control system (750) sends a signal to the remote system (752), wherein the signal is sent via infrared spectrum.

19. The system (100) of claim 1, wherein the local control system (750) comprises a wireless network communication card (766) operatively connected thereto.

20. The system (100) of claim 1, wherein a plurality of louver systems (100) are used, wherein the plurality of louver systems (100) are operated by a remote system (752).

21. The system (100) of claim 1, wherein a plurality of louver systems (100) are used, wherein the plurality of louver systems (100) are operated by the local control system (750) of a master louver system (100).

22. The system (100) of claim 1, wherein the housing (200) comprises a plurality of mounting apertures (250), wherein the housing (200) mounts to and interfaces with a duct (110) via fasteners (260) disposed through the mounting apertures (250).

23. The system (100) of claim 1, wherein the local control system (750) comprises a communications port (768) operatively connected thereto.

\* \* \* \* \*